United States Patent
Belter

[11] Patent Number: 6,038,134
[45] Date of Patent: Mar. 14, 2000

[54] MODULAR CAPACITOR/INDUCTOR STRUCTURE

[75] Inventor: Robert Belter, Santa Clarita, Calif.

[73] Assignee: Johanson Dielectrics, Inc.

[21] Appl. No.: 08/703,340

[22] Filed: Aug. 26, 1996

[51] Int. Cl.⁷ .............................. H05K 1/18; H05K 1/16
[52] U.S. Cl. .................... 361/763; 361/766; 361/782; 361/313
[58] Field of Search ............................ 361/301.4, 306.1, 361/313, 321.2, 328, 763, 766, 782, 811, 794; 29/25.42, 602; 336/58, 200, 183; 333/181, 185, 70

[56] References Cited

U.S. PATENT DOCUMENTS

| | | |
|---|---|---|
| 3,118,095 | 1/1964 | Baron et al. . |
| 3,636,481 | 1/1972 | Boulin et al. ............................ 333/70 |
| 3,694,710 | 9/1972 | Kirschner . |
| 3,761,853 | 9/1973 | Schutz et al. ............................ 336/58 |
| 3,765,082 | 10/1973 | Zyetz ........................................ 29/602 |
| 3,821,617 | 6/1974 | Shelby et al. . |
| 3,836,830 | 9/1974 | Akopian et al. . |
| 4,302,625 | 11/1981 | Hetherington et al. ................. 174/68.5 |
| 4,466,045 | 8/1984 | Coleman .................................. 361/277 |
| 4,467,393 | 8/1984 | Kupfer .................................... 361/278 |
| 4,470,096 | 9/1984 | Guertin .................................... 361/277 |
| 4,543,553 | 9/1985 | Mandai et al. ............................ 336/83 |
| 4,650,924 | 3/1987 | Nishigaki et al. ...................... 174/68.5 |
| 4,665,465 | 5/1987 | Tanabe .................................... 361/306 |
| 4,689,594 | 8/1987 | Kawabata et al. ...................... 336/200 |
| 4,733,327 | 3/1988 | Behn et al. .............................. 361/306 |
| 4,803,453 | 2/1989 | Tomono et al. ......................... 336/183 |
| 4,814,940 | 3/1989 | Horstmann et al. .................... 361/309 |
| 4,924,064 | 5/1990 | Stormbom et al. ................. 219/121.69 |
| 5,017,902 | 5/1991 | Yerman et al. ........................... 336/83 |
| 5,018,047 | 5/1991 | Insetta et al. ............................ 361/277 |
| 5,032,815 | 7/1991 | Kobayashi et al. ....................... 336/83 |
| 5,034,851 | 7/1991 | Monsorno et al. ...................... 361/321 |
| 5,192,871 | 3/1993 | Ramakrishnan et al. .............. 257/595 |
| 5,250,915 | 10/1993 | Ikeda et al. ............................. 333/181 |
| 5,278,526 | 1/1994 | Ikeda ...................................... 333/185 |
| 5,311,651 | 5/1994 | Kim et al. .............................. 29/25.42 |
| 5,345,361 | 9/1994 | Billotte et al. .......................... 361/313 |
| 5,347,423 | 9/1994 | deNeuf et al. .......................... 361/313 |
| 5,384,434 | 1/1995 | Mandai et al. .......................... 361/763 |

*Primary Examiner*—Kristine Kincaid
*Assistant Examiner*—Anthony Dinkins
*Attorney, Agent, or Firm*—Swernofsky Law Group

[57] ABSTRACT

A structure for a capacitor or inductor. The structure includes a set of modular elements which stack together in a rectilinear stack and are electrically coupled at known coupling points. The modular elements may be combined (by connection at the coupling points) to form a capacitor, an inductor, or a circuit having both capacitors and/or inductors as elements. The circuit is constructed by stacking modular elements together and laminating the stack. Multiple circuits having capacitors and/or inductors are constructed at once using a stack of sheets of modular elements. Each stack is then cut into individual circuits and the circuits are fired to bake out organic material.

3 Claims, 5 Drawing Sheets

MODULAR CAPACITOR/INDUCTOR STRUCTURE

BACKGROUND OF THE INVENTION

1. Field of the Invention

This invention relates to a modular capacitor/inductor structure.

2. Description of Related Art

Electrical circuits commonly include a number of types of circuit elements, including capacitors, inductors, and elements having both capacitive and inductive components. It would be advantageous to be able to include such elements in electrical circuits without having to redesign each such element from first principles. For example, it would be advantageous to be able to create such elements from modular parts which are combined to form elements such as capacitors, inductors, or elements having both capacitive and inductive components.

The following U.S. Patents may be pertinent:

U.S. Pat. No. 3,118,095, issued Jan. 14, 1964, in the name of F. E. Baron, et al., titled "Capacitor and Terminal Therefor";

U.S. Pat. No. 3,636,481, issued Jan. 18, 1972, in the name of Jaques R. Boulin, et al., titled "Modular Elements for Electrical Filters and Filters Employing the Same";

U.S. Pat. No. 3,761,853, issued Sep. 25, 1973, in the name of Richard F. Schutz, et al., titled "Mechanically Variable Modular High Reactivity Power Inductor for High A.C. Voltage Resonant Testing of Capacitive Loads";

U.S. Pat. No. 3,765,082, issued Oct. 16, 1973, in the name of M. Charles Zyetz, titled "Method of Making an Inductor Chip";

U.S. Pat. No. 4,543,553, issued Sep. 24, 1985, in the name of Harufumi Mandai, et al., titled "Chip-Type Inductor";

U.S. Pat. No. 4,665,465, issued May 12, 1987, in the name of Takeshi Tanabe, titled "Feed-Through Type Multilayer Capacitor";

U.S. Pat. No. 4,689,594, issued Aug. 25, 1987, in the name of Toshio Kawabata, et al., titled "Multi-Layer Chip Coil";

U.S. Pat. No. 4,733,327, issued Mar. 22, 1988, in the name of Reinhard Behn, et al., titled "Electrical Capacitor";

U.S. Pat. No. 4,803,453, issued Feb. 7, 1989, in the name of Kunisaburo Tomono, et al., titled "Laminated Transformer";

U.S. Pat. No. 4,814,940, issued Mar. 21, 1989, in the name of Richard E. Horstmann, et al., titled "Low Inductance Capacitor";

U.S. Pat. No. 5,017,902, issued May 21, 1991, in the name of Alexander J. Yerman, et al., titled "Conductive Film Magnetic Components";

U.S. Pat. No. 5,032,815, issued Jul. 16, 1991, in the name of Takashi Kobayashi, et al., titled "Lamination Type Inductor";

U.S. Pat. No. 5,250,915, issued Oct. 5, 1993, in the name of Takeshi Ikeda, et al., titled "Laminate Type LC Filter";

U.S. Pat. No. 5,278,526, issued Jan. 11, 1994, in the name of Takeshi Ikeda, titled "Laminated LC Element and Method for Manufacturing the Same"; and U.S. Pat. No. 5,311,651, issued May 17, 1994, in the name of Yoon Ho Kim, et al., titled "Method for Manufacturing Multi-Layer Ceramic Capacitor".

Accordingly, it would be advantageous to provide an improved structure for, and method for making, modular capacitors and inductors.

SUMMARY OF THE INVENTION

The invention provides a structure for a circuit element such as a capacitor or inductor, and a method for making that structure. The structure comprises a set of ceramic sheets which stack together in a rectilinear stack and are electrically coupled at known coupling points. The ceramic sheets are combined (by connection at the coupling points) to form a circuit element such as a capacitor or an inductor, or a circuit having a plurality of such circuit elements as components. The circuit is constructed by stacking the ceramic sheets together and laminating and baking the stack. In a preferred embodiment, a plurality of such circuits are constructed at once using a stack of ceramic sheets, each replicating a part of one such circuit a plurality of times. Each stack is then cut into individual circuits and the circuits are fired to bake out surplus organic material.

DESCRIPTION OF THE PREFERRED EMBODIMENT

APPARATUS FOR CONSTRUCTING A CIRCUIT FROM MULTIPLE CERAMIC SHEETS

Figure 1:
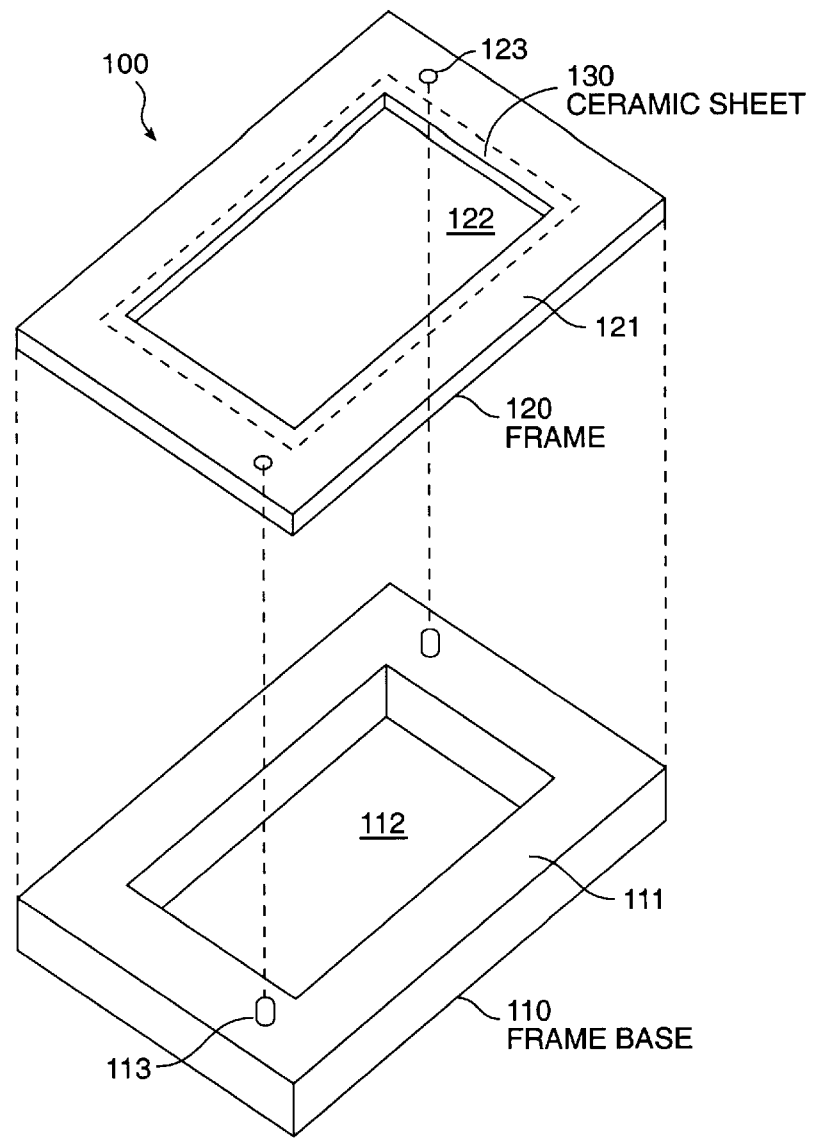
FIG. 1 is a diagram of an arrangement for constructing a circuit from ceramic sheets.

FIG. 1 is a diagram of an arrangement for constructing a circuit from ceramic sheets.

An assembly 100 for constructing a circuit comprises a frame base 110 and a frame 120.

The frame base 110 comprises a base region 111 having a flat surface for the frame 120 to rest upon, an empty region 112 defined by the base region 111, and a plurality of alignment pegs 113 for aligning the frame base 110 with the frame 120.

The frame 120 comprises a frame piece 121 for holding a ceramic sheet 130, an empty region 122 defined by the frame piece 121, and a plurality of alignment holes 123 for aligning the frame base 110 with the frame 120, using the alignment pegs 113. In a preferred embodiment, the frame 120 is between about 20 mils and about 30 mils thick (a mil is 1/1000 of an inch).

In alternative embodiments, the alignment pegs 113 may instead comprise holes for alignment and the alignment holes 123 may instead comprise pegs for alignment, so that the frame base 110 and the frame 120 can be aligned in a similar manner. Other and further alternative techniques for aligning the frame base 110 and the frame 120 are also within the scope and spirit of the invention.

The ceramic sheet 130 is attached to the frame 120 by gluing or otherwise attaching it to the frame piece, so as to cover the empty region 122, and so that when the frame 120 is aligned with the frame base 110 using the alignment pegs 113 and alignment holes 123, the ceramic sheet 130 covers the empty region 112.

In a preferred embodiment, the ceramic sheet 130 has a length of about 5 inches, a width between about 6 inches, and a thickness between about 0.5 mils and about 1.7 mils.

In a preferred embodiment, the ceramic sheet 130 preferably comprises a material such as NPO, X7R, Z5U, Y5V, or other known dielectric or nondielectric materials. In alternative embodiments, each ceramic sheet 130 may comprise other materials or have other dimensions, such as another known ceramic or a composition using glass.

In alternative embodiments, the ceramic sheet 130 may comprise other shapes or have other dimensions, such as a regular polygon of more or less than four sides, a rounded shape such as a circle, ellipse, or other oval, or another shape.

Figure 2:
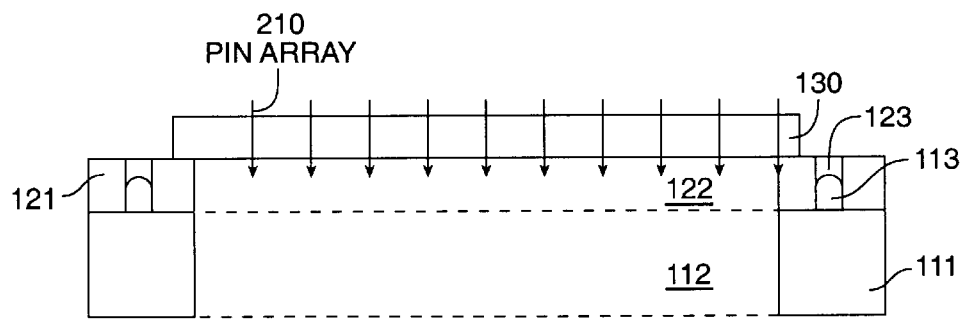
FIG. 2 is a diagram of an arrangement for punching holes in ceramic sheets.

FIG. 2 is a diagram of an arrangement for punching holes in ceramic sheets.

In FIG. 2, the frame base 110 is shown in a side view, and showing the base region 111, the empty region 112, and the alignment pegs 113. The frame 120 is also shown in a side view, resting upon the frame base 110, and showing the frame piece 121, the empty region 122, and the alignment holes 123. The ceramic sheet 130 is also shown in a side view, resting upon the frame 120 and disposed above the empty region 122 and the empty region 112.

A plurality of punch pins 210 is disposed in an array above the ceramic sheet 130, and positioned so as to punch a plurality of holes in the ceramic sheet 130 in a regular array.

Figure 3:
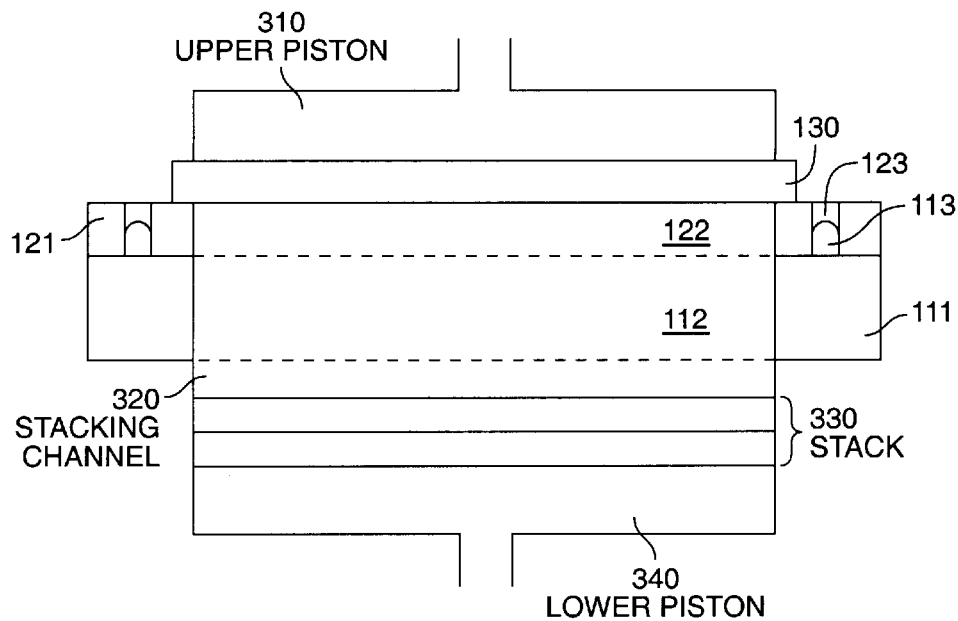
FIG. 3 is a third diagram of an arrangement for combining a plurality of ceramic sheets.

FIG. 3 is a third diagram of an arrangement for combining a plurality of ceramic sheets.

As in FIG. 2, the frame base 110 is shown in a side view, and showing the base region 111, the empty region 112, and the alignment pegs 113. The frame 120 is also shown in a side view, resting upon the frame base 110, and showing the frame piece 121, the empty region 122, and the alignment holes 123.

A first ceramic sheet 130 is also shown in a side view, resting upon the frame 120 and disposed above the empty region 122 and the empty region 112.

An upper piston 310 is disposed above the first ceramic sheet 130, and positioned so as to punch the ceramic sheet 130 through the empty region 122 and the empty region 112 through to a stacking channel 320, where a stack 330 comprising a plurality of ceramic sheets 130 is disposed above a lower piston 340.

Thus, the first ceramic sheet 130 will be punched by the upper piston 310 (leaving a small part of the first ceramic sheet 130 glued to the frame 120), and pressed into the stack 330 in conjunction with the lower piston 340. In a preferred embodiment, the first ceramic sheet 130 is pressed into the stack 330 using a pressure between about 500 PSI and about 2000 PSI and a temperature above about 50° Celsius.

In a preferred embodiment, the frame base 110 in FIG. 3 is distinct from the frame base 110 in FIG. 2, so that the ceramic sheets may be punched using the plurality of punch pins 210 at a first frame base 110, and may be punched using the upper piston 310 and the lower piston 340 at a second frame base 110. However, in alternative embodiments, the frame base 110 in FIG. 3 may be the same frame base as in FIG. 2.

After each ceramic sheet 130 is pressed into the stack 330, a conductive ink or another conductive flowable substance is flowed into the stacking channel 320 onto the ceramic sheet 130 using a mask (not shown), so as to create a conductive pattern on the surface of the ceramic sheet 130.

In a preferred embodiment, the conductive ink is preferably a metallic ink such as a palladium silver ink. However, a prepared ferrite or ceramic/ferrite composition could be preferred for forming inductor circuits. The conductive ink is flowed onto the ceramic sheet 130 using a stainless steel screen, and has a resultant thickness of between about 1 micron and about 2 microns. In alternative embodiments, the conductive ink may comprise other materials or have other dimensions, such as a conductive nonmetallic material or a conductive ink or other liquid.

Figure 4:
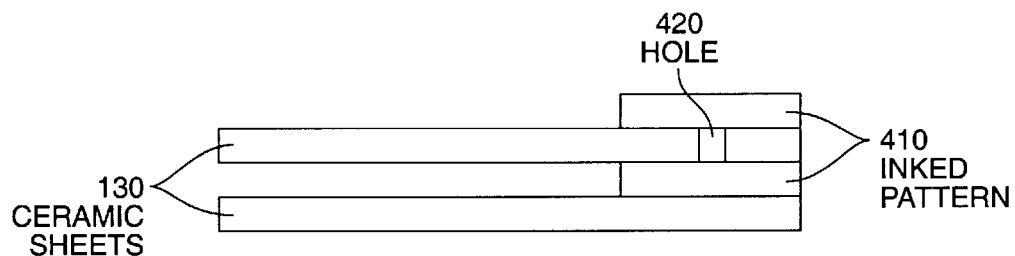
FIG. 4 is a diagram of an arrangement for electrical conductivity between pairs of ceramic sheets.

FIG. 4 is a diagram of an arrangement for electrical conductivity between pairs of ceramic sheets.

In FIG. 4, a ceramic sheet 130 is shown in a side view, showing the ceramic sheet 130, an inked pattern 410 printed on top of the ceramic sheet 130, and a hole 420 defined through the ceramic sheet 130. Because the hole 420 is punched through the ceramic sheet 130 (using the apparatus of FIG. 2) before the conductive ink is flowed onto the ceramic sheet 130, the hole 420 fills with the conductive ink and the conductive ink electrically couples a portion of the inked pattern 410 for a first ceramic sheet 130 with a portion of the inked pattern 410 for a second ceramic sheet 130 disposed directly above the first ceramic sheet 130.

Thus, a circuit comprising the inked pattern 410 disposed on each ceramic sheet 130, coupled by conductive ink in the holes 420, is formed using a plurality of ceramic sheets 130 in a stack.

INDIVIDUAL CIRCUITS CONSTRUCTED FROM MULTIPLE CERAMIC SHEETS

Figure 5:
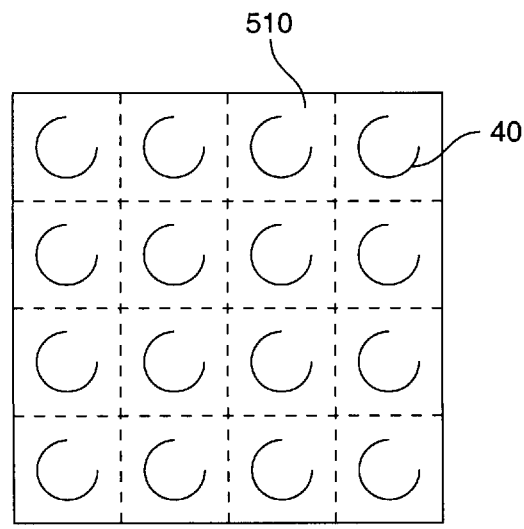
FIG. 5 is a diagram showing a single ceramic sheet which replicates a part of a circuit a plurality of times.

FIG. 5 is a diagram showing a single ceramic sheet which replicates a part of a circuit a plurality of times.

Each ceramic sheet 130 comprises a plurality of regions 510 on which individual inked patterns 410 are defined. In a preferred embodiment, each ceramic sheet 130 has the same inked pattern 410 repeated throughout, and there are a plurality of ceramic sheets 130, each for a different type of inked pattern 410.

Thus, a first ceramic sheet 130 would have a first type of inked pattern 410 repeated throughout, and a second ceramic sheet 130 would have a second type of inked pattern 410 repeated throughout. A circuit comprising a plurality of ceramic sheets 130 would have a first ceramic sheet 130 with a first type of inked pattern 410, then a second ceramic sheet 130 with a second type of inked pattern 410, then possibly a third ceramic sheet 130 with a third type of inked pattern 410, and so on.

INDIVIDUAL CAPACITOR CIRCUIT

Figure 6A:
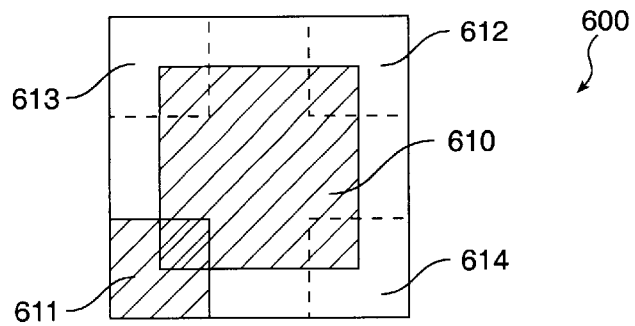
FIGS. 6A and 6B are diagrams showing the first and second plates for an individual capacitor circuit.
Figure 6B:
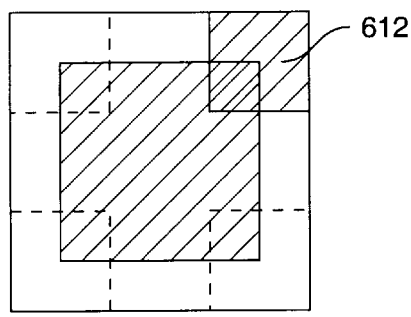

FIG. 6A and 6B are diagrams showing the first and second plates for an individual capacitor circuit.

A capacitor circuit 600 comprises a first ceramic sheet 130 with a first type of inked pattern 410 and a second ceramic sheet 130 with a second type of inked pattern 410, alternated repeatedly.

The first type of inked pattern 410 comprises a central region 610 and a first corner 611 of the ceramic sheet 130 both substantially covered with conductive ink to form a first plate for the capacitor circuit 600. Similarly, the second type of inked pattern 410 comprises the same central region 610 and a second corner 612 of the ceramic sheet 130 both substantially covered with conductive ink to form a second plate for the capacitor circuit 600. In a preferred embodiment, the capacitor circuit 600 comprises between about 10 and about 150 such ceramic sheets 130.

The capacitor circuit 600 may alternatively be constructed using a third corner 613 instead of the first corner 611 and a fourth corner 614 instead of the second corner 612, or in fact using any two corners of the ceramic sheet 130.

The first plate for the capacitor circuit 600 and the second plate for the capacitor circuit 600 are uncoupled.

INDIVIDUAL INDUCTOR CIRCUIT

Figure 7:
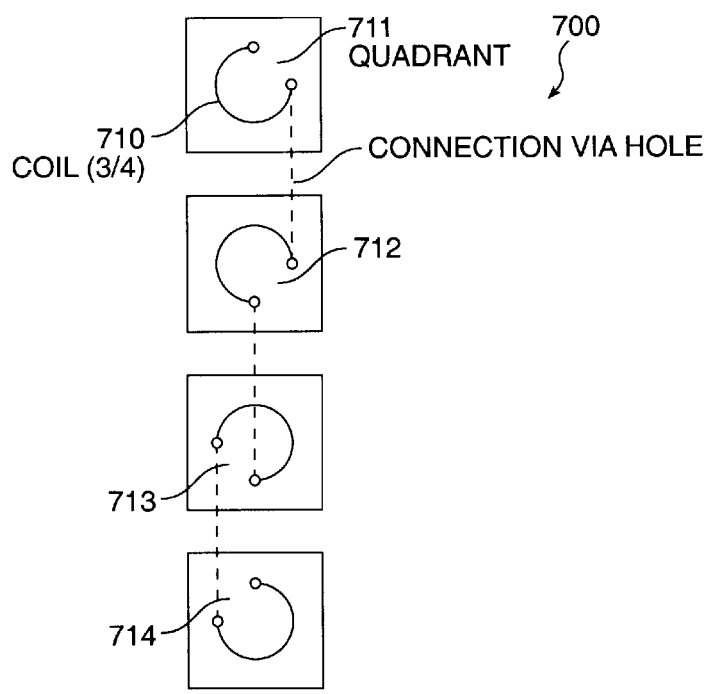
FIG. 7 is a diagram showing a sequence of ceramic sheets disposed to form a coil for an individual inductor circuit.

FIG. 7 is a diagram showing a sequence of ceramic sheets disposed to form a coil for an individual inductor circuit.

An inductor circuit 700 comprises a plurality of ceramic sheets 130 having a sequence of four types of inked patterns 410. Each type of inked pattern 410 comprises a "C"-shaped curve 710 proceeding ¾ of the way around a circle. Thus, a first type of inked pattern 410 includes all of the circle except a first quadrant 711, a second type of inked pattern 410 includes all of the circle except a second quadrant 712, a third type of inked pattern 410 includes all of the circle except a third quadrant 713, and a fourth type of inked pattern 410 includes all of the circle except a fourth quadrant 714.

The first type of inked pattern 410, the second type of inked pattern 410, the third type of inked pattern 410, and the fourth type of inked pattern 410 are coupled in series to form a coil having a helix shape, each ceramic sheet 130 providing ¾ of a turn for the coil. In a preferred embodiment, the inductor circuit 700 comprises between about 10 and about 150 such ceramic sheets 130.

In a preferred embodiment, one or more ceramic sheets 130 are used as nonconductive spacers between turns of the coil.

One or more ceramic sheets 130 also has its portion of the coil coupled to the first corner 611 or another corner, so as to couple the inductor circuit 700 to external wiring.

A high-frequency transformer circuit may be constructed in a similar manner, such as by providing alternating portions of two interspersed coils.

INDIVIDUAL RESISTOR CIRCUIT

Figure 8:
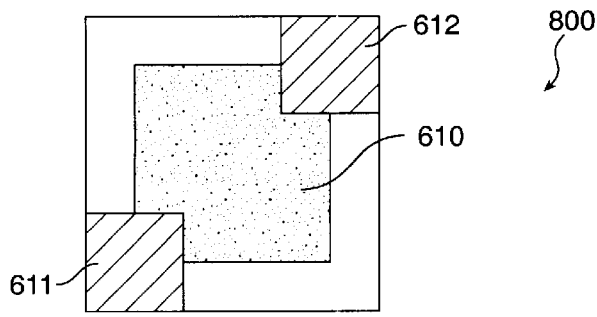
FIG. 8 is a diagram showing a sequence of ceramic sheets disposed to form a coil for an individual resistor circuit.

FIG. 8 is a diagram showing a sequence of ceramic sheets disposed to form a coil for an individual resistor circuit.

A resistor circuit 800 comprises a ceramic sheet 130 having the first corner 611 and the second corner 612, or alternatively any two corners, coupled to the central region 610, with the central region 610 comprising a resistive material. The resistor circuit 800 comprises a plurality of such ceramic sheets 130 coupled in series, thus collectively forming a resistor circuit 800 with a plurality of lengths of the resistive material.

INDIVIDUAL COMPLEX CIRCUIT

Figure 9:
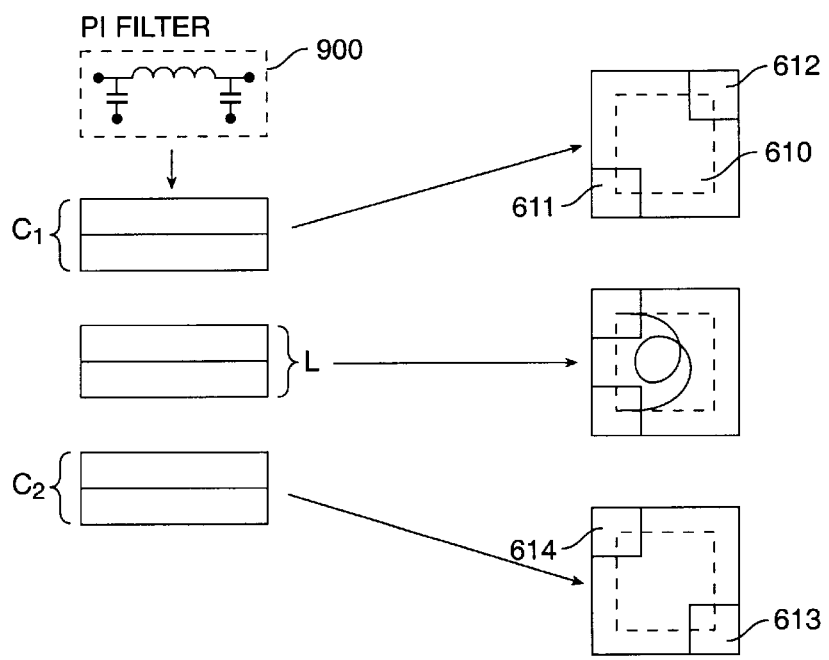
FIG. 9 is a diagram showing construction of a complex circuit.

FIG. 9 is a diagram showing construction of a complex circuit.

A complex circuit 900 comprises a plurality of circuits such as capacitor circuits 600, inductor circuits 700, resistor circuits 800, and possibly other circuits, electrically coupled to form the complex circuit 900.

The ceramic sheets 130 for the circuits are stacked with at least some of their corners 611, 612, 613, 614 coupled, so as to form the complex circuit 900.

In the example shown in FIG. 9, a pi filter circuit comprises a first capacitor circuit 600, an inductor circuit 700, and a second capacitor circuit element 600, disposed to form the pi filter circuit.

Similarly, the complex circuit 900 may comprise an L filter, a plurality of capacitors coupled in series or in parallel, a plurality of inductors coupled in series or in parallel, or another circuit using capacitors, inductors, and resistors.

METHOD OF CONSTRUCTING A CIRCUIT FROM MULTIPLE CERAMIC SHEETS

Figure 10:
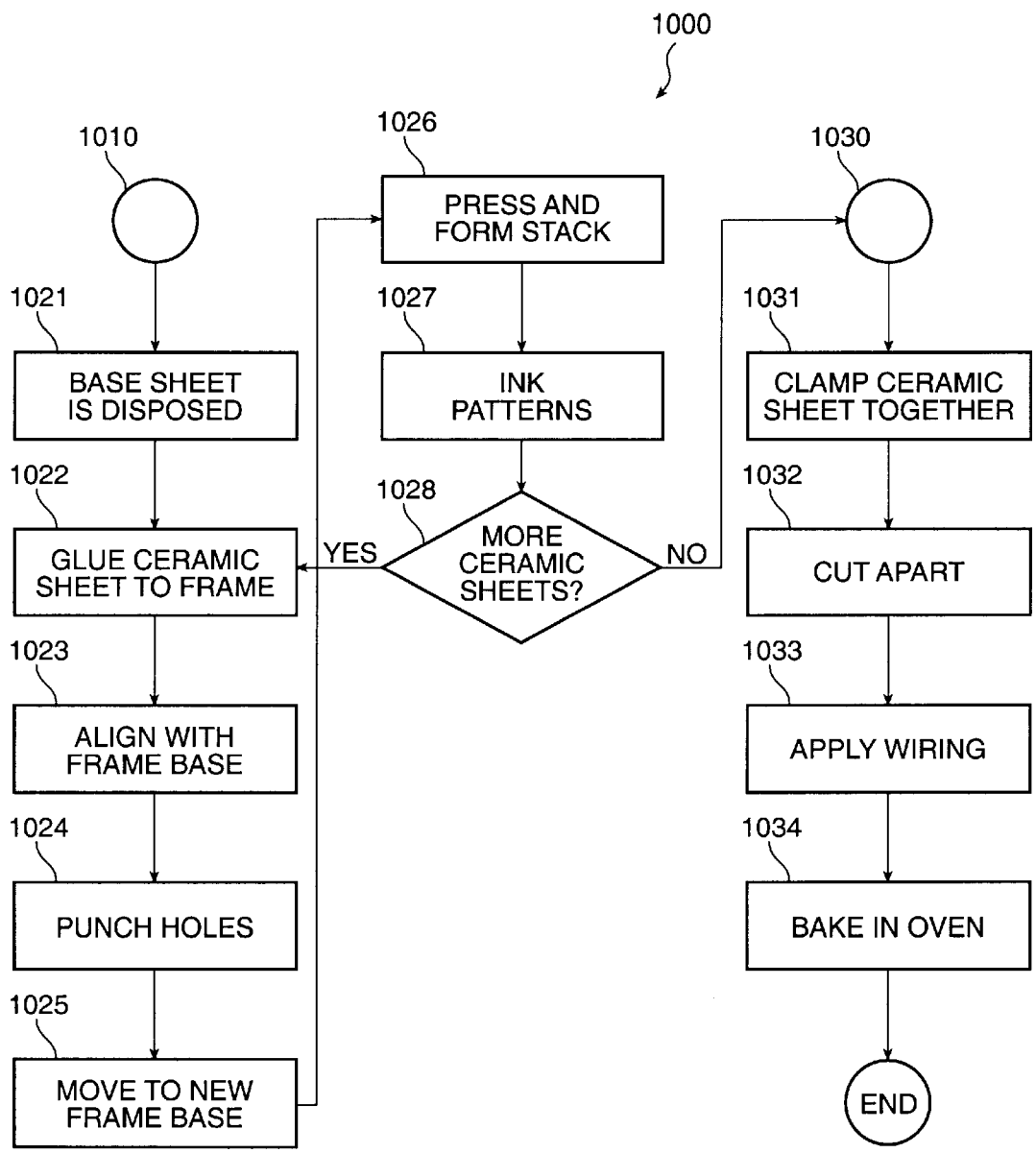
FIG. 10 is a flow diagram of a method for constructing a circuits from ceramic sheets.

FIG. 10 is a flow diagram of a method for constructing a circuits from ceramic sheets.

The method 1000 comprises a sequence of steps to be executed in order, except where a branch or change of order is indicated.

At a flow point 1010, it is desired to create a circuit from a plurality of ceramic sheets 130.

At a step 1021, a base ceramic sheet 130 is disposed in the apparatus of FIG. 3. The base ceramic sheet 130 comprises a circuit pattern for starting the circuit and does not have holes 410 defined therein using the apparatus of FIG. 2. In a preferred embodiment, the base ceramic sheet 130 is thicker than the ordinary ceramic sheet 130, such as by disposing about three to about four ordinary ceramic sheets 130 together, but in alternative embodiments the base ceramic sheet 130 may be the same thickness as the ordinary ceramic sheets 130.

At a step 1022, one ceramic sheet 130 is attached to the frame 120, such as by gluing.

At a step 1023, the frame 120 is aligned with the frame base 110 in the apparatus of FIG. 2, using the alignment pegs 113 and the alignment holes 123.

At a step 1024, the punch pins 210 are used to punch a plurality of holes in the ceramic sheet 130 in a regular array.

At a step 1025, the frame 120 is removed from the apparatus of FIG. 2, and is aligned with the frame base 110 in the apparatus of FIG. 3, using the alignment pegs 113 and the alignment holes 123.

At a step 1026, the upper piston 310 and the lower piston 340 are used to punch the ceramic sheet 130 out from the frame 120 and to form the stack 330 of ceramic sheets 130.

At a step 1027, the conductive ink is flowed onto the top of the ceramic sheet 130 at the top of the stack 330, so as to form the inked pattern 410.

At a step 1028, it is determined whether there are more ceramic sheets 130 to be added to the stack 330. If so, the method 1000 proceeds with the step 1022. If not, the method 1000 proceeds with the flow point 1030.

At a flow point 1030, all of the ceramic sheets 130 needed for the circuit have been added to the stack 330.

At a step 1031, the ceramic sheets 130 are clamped or otherwise coupled together in the stack 330, and laminated together in the stack 330.

At a step 1032, the ceramic sheets 130 are cut apart into individual circuits, using a saw cutter or guillotine cutter.

At a step 1033, external wiring is coupled to each individual circuit.

At a step 1034, the individual circuits are baked in an oven to bake out any surplus organic materials. In a preferred embodiment, this step is performed by firing the individual circuits at between about 320° Celsius and about 330° Celsius for between about 10 minutes and about 30 minutes in a neutral gas atmosphere.

EXTERNAL WIRING FOR A CIRCUIT FORMED USING CERAMIC SHEETS

Figure 11:
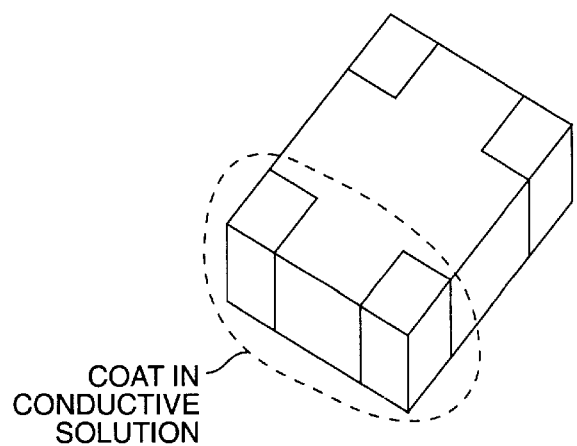
FIG. 11 is a diagram of an arrangement for external wiring for a circuit formed using ceramic sheets.

FIG. 11 is a diagram of an arrangement for external wiring for a circuit formed using ceramic sheets.

When the ceramic sheets 130 are stacked, laminated, and cut apart, the corners 611, 612, 613, 614, are exposed. Selected corners are dipped in or painted with a conductor, such as a silver emulsion, and plated with nickel or tin, so as to electrically couple those corners.

For example, for the capacitor circuit 600, the first corner 611 is painted with a conductor and plated to electrically couple all the first plates of the capacitor circuit 600, and the second 612 is painted with a conductor and plated to electrically couple all the second plates of the capacitor circuit 600.

Alternative Embodiments

Although preferred embodiments are disclosed herein, many variations are possible which remain within the concept, scope, and spirit of the invention, and these variations would become clear to those skilled in the art after perusal of this application.

I claim:

1. A circuit comprising a plurality of ceramic sheets, each one of said ceramic sheets having an array of parts of circuits disposed thereon;

said ceramic sheets being stacked together in a rectilinear stack, said ceramic sheets being electrically coupled at a set of known coupling points wherein at least one of said coupling points comprises a hole defined in at least one of said ceramic sheets and filled therethrough with a conductor wherein said circuit comprises an inductive element and at least one of said parts of circuits comprises at least part of an inductive coil.

2. A circuit as in claim 1, wherein said circuit includes a capacitive element and at least one of said parts of circuits comprises at least part of a capacitor plate.

3. A circuit as in claim 2, wherein said circuit includes a resistive element and at least one of said parts of circuits comprises at least part of a resistor.

* * * * *